United States Patent
Ikedo et al.

(10) Patent No.: US 9,277,113 B2
(45) Date of Patent: Mar. 1, 2016

(54) IMAGE PICKUP APPARATUS AND DRIVING METHOD THEREFOR

(71) Applicant: CANON KABUSHIKI KAISHA, Tokyo (JP)

(72) Inventors: Hideki Ikedo, Kawasaki (JP); Takafumi Kishi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/035,452

(22) Filed: Sep. 24, 2013

(65) Prior Publication Data

US 2014/0118587 A1    May 1, 2014

(30) Foreign Application Priority Data

Oct. 29, 2012 (JP) ................................. 2012-238000

(51) Int. Cl.
| | |
|---|---|
| *H04N 5/232* | (2006.01) |
| *H04N 5/378* | (2011.01) |
| *H04N 5/369* | (2011.01) |
| *H01L 27/146* | (2006.01) |

(52) U.S. Cl.
CPC ...... *H04N 5/23212* (2013.01); *H01L 27/14627* (2013.01); *H01L 27/14641* (2013.01); *H04N 5/3696* (2013.01); *H04N 5/378* (2013.01)

(58) Field of Classification Search
CPC . H04N 5/23212; H04N 5/378; H04N 5/3696; H01L 27/14627; H01L 27/14641

USPC .......................................... 348/281, 294, 302
See application file for complete search history.

(56) References Cited

U.S. PATENT DOCUMENTS

| | | | |
|---|---|---|---|
| 2009/0021621 A1* | 1/2009 | Hashimoto et al. ........... 348/300 |
| 2009/0140122 A1* | 6/2009 | Suzuki ....................... 250/201.2 |
| 2010/0165176 A1* | 7/2010 | Taniguchi .................... 348/345 |
| 2012/0138773 A1* | 6/2012 | Taniguchi .................. 250/208.1 |

FOREIGN PATENT DOCUMENTS

JP    2001-124984 A    5/2001

* cited by examiner

*Primary Examiner* — Gevell Selby
(74) *Attorney, Agent, or Firm* — Cowan, Liebowitz & Latman, P.C.

(57) ABSTRACT

An image pickup apparatus includes an image pickup unit including a plurality of photoelectric conversion elements provided correspondingly to each of microlenses arranged two-dimensionally, reads out a first signal through addition from the photoelectric conversion elements corresponding to the microlense, reads out a second signal from one of the photoelectric conversion elements corresponding to the microlense, and sets one of a first and second read-out modes to read signals from the image pickup unit in accordance with a photographing condition, wherein the first and second read-out modes differ in read-out density of the second signal in a read-out area in accordance with one of a thinning-out rate and an addition rate of a area from which the second signal is read out being different as compared to a area from which the first signal is read out.

42 Claims, 16 Drawing Sheets

*FIG. 6*

IMAGE A

|   | 0 | 1 | 2 | 3 | 4 | 5 | 6 | 7 |
|---|---|---|---|---|---|---|---|---|
| 0 | R | G | R | G | R | G | R | G |
| 1 | G | B | G | B | G | B | G | B |
| 2 | R | G | R | G | R | G | R | G |
| 3 | G | B | G | B | G | B | G | B |

IMAGE A + B

|   | 0 | 1 | 2 | 3 | 4 | 5 | 6 | 7 |
|---|---|---|---|---|---|---|---|---|
| 0 | R | G | R | G | R | G | R | G |
| 1 | G | B | G | B | G | B | G | B |
| 2 | R | G | R | G | R | G | R | G |
| 3 | G | B | G | B | G | B | G | B |

FIG. 10

IMAGE PICKUP APPARATUS AND DRIVING METHOD THEREFOR

BACKGROUND OF THE INVENTION

1. Field of the Invention

The present invention relates to an image pickup apparatus and driving method therefor, and more particularly, to an image pickup apparatus and driving method therefor, capable of focus detection based on a pupil division method.

2. Description of the Related Art

Recently, solid-state image pickup elements used for image pickup apparatuses such as digital still cameras and digital video cameras have been growing in functionality.

Japanese Patent Application Laid-Open No. 2001-124984 discloses a technique capable of focus detection based on a pupil division method in relation to an image pickup element. According to Japanese Patent Application Laid-Open No. 2001-124984, each pixel of the image pickup element has two photodiodes, which are configured to receive, by means of a single microlens, light passing through respective different pupils of a photographing lens. Thus, the photographing lens can detect focus by comparing output signals from the two photodiodes. Also, by adding the output signals from the two photodiodes, a signal of a normal photographing image can be obtained.

On order to perform focus detection by using an image pickup element in which each pixel contains two photodiodes in the case of Japanese Patent Application Laid-Open No. 2001-124984, a signal needs to be acquired from each of the two photodiodes. Consequently, if focus detection signals are to be obtained in an entire pixel area, the quantity of signals to be read out increases two-fold compared to a conventional image pickup element in which each pixel contains a single photodiode, substantially increasing a read-out time.

SUMMARY OF THE INVENTION

In view of the above problem, an aspect of the present invention is to provide an image pickup apparatus capable of obtaining a focus detection signal of an optimal range in accordance with a photographing condition while suppressing increases in signal read-out time.

To accomplish the above aspect, an image pickup apparatus of the invention comprises an image pickup unit in which a plurality of photoelectric conversion elements are provided correspondingly to each of microlenses arranged two-dimensionally, a read-out unit configured to read out a first signal through addition from the plurality of photoelectric conversion elements corresponding to the microlense, and read out a second signal from one of the plurality of photoelectric conversion elements corresponding to the microlense, and a setting unit configured to set one of a first read-out mode and a second read-out mode in order for the read-out unit to read signals from the image pickup unit in accordance with a photographing condition, wherein the first read-out mode and the second read-out mode differ in read-out density of the second signal in a read-out area in accordance with one of a thinning-out rate and an addition rate of a area from which the second signal is read out being different as compared to an area from which the first signal is read out.

Further features of the present invention will become apparent from the following description of exemplary embodiments with reference to the attached drawings.

BRIEF DESCRIPTION OF THE DRAWINGS

FIG. 6 is a diagram illustrating read-out pixels of the image pickup element in the image pickup apparatus according to the first embodiment of the present invention.

FIG. 10 is a diagram illustrating an example of read-out pixels according to a first modification of the first embodiment of the present invention.

DESCRIPTION OF THE EMBODIMENTS

Preferred embodiments of the present invention will now be described in detail in accordance with the accompanying drawings.

First Embodiment

First, principles of focus detection by a pupil division method in an image pickup apparatus will be described.

Figure 1:
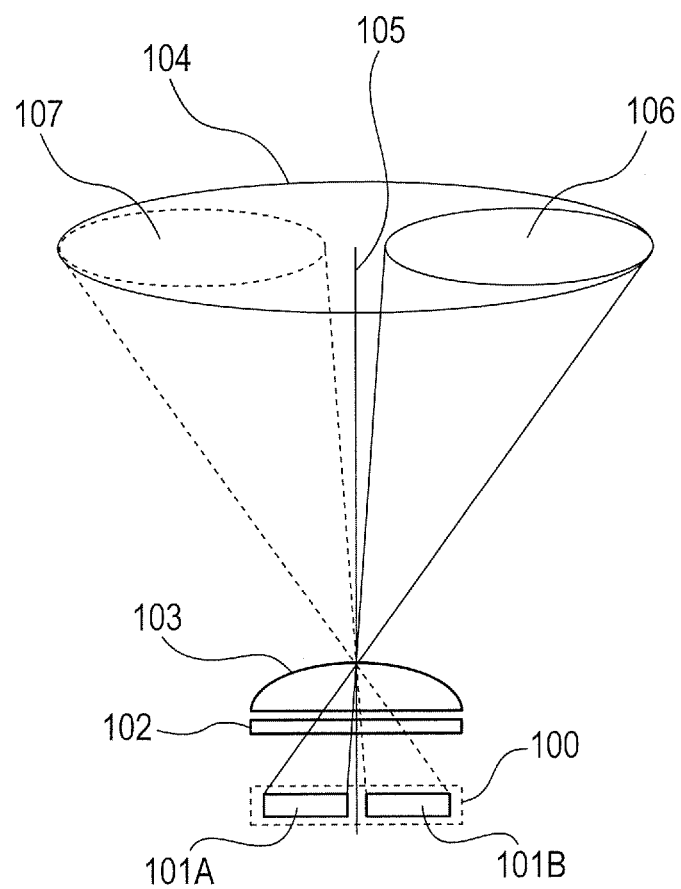
FIG. 1 is a diagram conceptually illustrating rays of light when a light exiting from an exit pupil of a photographing lens is incident on a unit pixel having plural photoelectric conversion elements.

FIG. 1 is a diagram conceptually illustrating rays of light when a light exiting from an exit pupil of a photographing lens is incident on a unit pixel.

In FIG. 1, a unit pixel 100 includes a first photodiode 101A and a second photodiode 101B. Reference numerals 102, 103 and 104 denote a color filter 102, a microlens 103, and an exit pupil 104 of the photographing lens, respectively.

In the unit pixel provided with the microlens 103, if the center of the light exiting from the exit pupil coincides with an optical axis 105, light passing through the exit pupil is incident upon the unit pixel 100, centering on the optical axis 105. As illustrated in FIG. 1, when 106 and 107 denote partial areas of the exit pupil of the photographing lens, the light passing through the pupil area 106 is received by the photodiode 101A through the microlens 103. Likewise, the light passing through the pupil area 107 is received by the photodiode 101B through the microlens 103. Thus, the photodiodes 101A and 101B receive light from respective different areas of the exit pupil of the photographing lens, and detection of a phase difference is enabled by comparing signals from the photodiodes 101A and 101B.

Here, if a signal obtained from the photodiode 101A is defined as an image-A signal, a signal obtained from the photodiode 101B is defined as an image-B signal, and an added signal obtained by adding the image-A signal and image-B signal is defined as an image A+B signal, the image A+B signal can be used for a photographing image.

Figure 2:
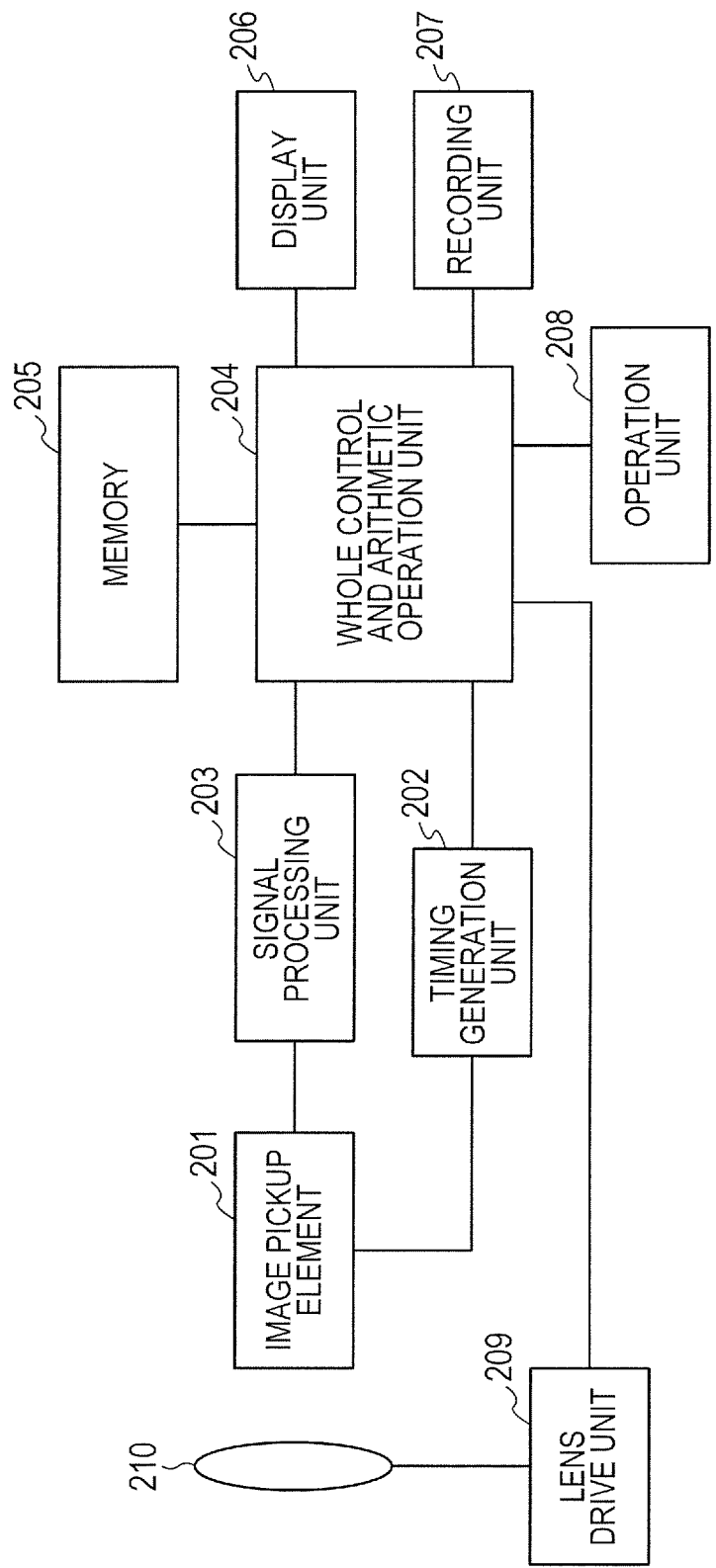
FIG. 2 is a block diagram of an image pickup apparatus according to a first embodiment of the present invention.

A block diagram of an image pickup apparatus 200 according to a first embodiment of the present invention is illustrated in FIG. 2. In FIG. 2, a photographing lens 210 is included in a photographing optical system which forms an optical image of an object on an image pickup element 201 and driven by a lens drive unit 209 in zoom control, focus control, and aperture control. The image pickup element 201 picks up the image of the object formed by the photographing lens 210 and thereby captures the image as an image signal. The image pickup element 201 includes a pixel array in which the unit pixels 100 illustrated in FIG. 1 are arranged two-dimensionally. A signal processing unit 203 makes various corrections to the image signal output from the image pickup element 201 and compresses data. Also, the signal processing unit 203 generates the image-B signal from the image-A signal and image A+B signal acquired from the image pickup element 201. A timing generation unit 202 outputs a drive timing signal to the image pickup element 201. An overall control and computing unit 204 controls various arithmetic operations and the entire image pickup apparatus as well as controls focus detection operation using the image-A signal and image-B signal. A memory 205 temporarily stores image data subjected to signal processing and a display unit 206 displays various information and a photographing image. A recording unit 207 performs recording on a removable recording medium such as a semiconductor memory used to record and read image data. An operation unit 208 electrically accepts user operations performed via an operation member (not illustrated) of a digital camera.

Next, a configuration of the image pickup element 201 of the image pickup apparatus 200 according to the present embodiment will be described with reference to FIGS. 3 and 4.

Figure 3:
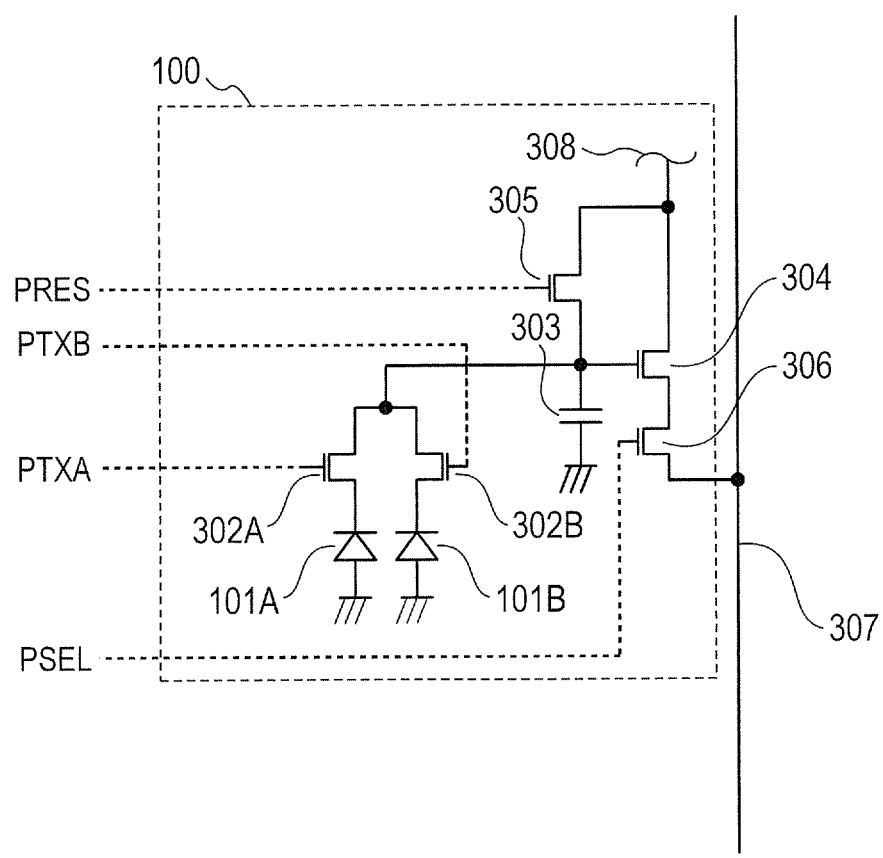
FIG. 3 is a circuit configuration diagram of a unit pixel of an image pickup element in the image pickup apparatus according to the first embodiment of the present invention.

FIG. 3 is a partial diagram illustrating the unit pixel 100 of the image pickup element 201, in which the same components as those in FIG. 1 are designated with the same reference numerals as the corresponding components in FIG. 1.

As illustrated in FIG. 3, the unit pixel 100 includes the first photodiode 101A, the second photodiode 101B, a first transfer switch 302A, a second transfer switch 302B, a floating diffusion area 303, and an amplification unit 304. Furthermore, the unit pixel includes a reset switch 305 and a selector switch 306. Also, a common power supply VDD 308 is provided.

The photodiodes 101A and 101B function as photoelectric conversion elements which receive light passing through the same microlens and generate signal charges corresponding to the received light amount. In this case, the microlens functions as a pupil division means.

The transfer switches 302A and 302B selectively transfer the charges generated, respectively, by the photodiodes 101A and 101B to the common floating diffusion area 303. The transfer switches 302A and 302B are controlled by transfer pulse signals PTXA and PTXB, respectively.

The floating diffusion area 303 temporarily holds charges transferred from the photodiodes 101A and 101B, and functions as a charge voltage conversion unit configured to convert the held charges into a voltage signal.

The amplification unit 304, which is a source follower MOS transistor, amplifies the voltage signal which is based on the charges held in the floating diffusion area 303 and outputs the voltage signal as a pixel signal.

The reset switch 305 is controlled by a reset pulse signal PRES and is configured to reset a potential of the floating diffusion area 303 to a reference potential VDD.

The selector switch 306 is controlled by a vertical selection pulse signal PSEL and is configured to output the pixel signal amplified by the amplification unit 304 to a vertical output line 307.

Figure 4:
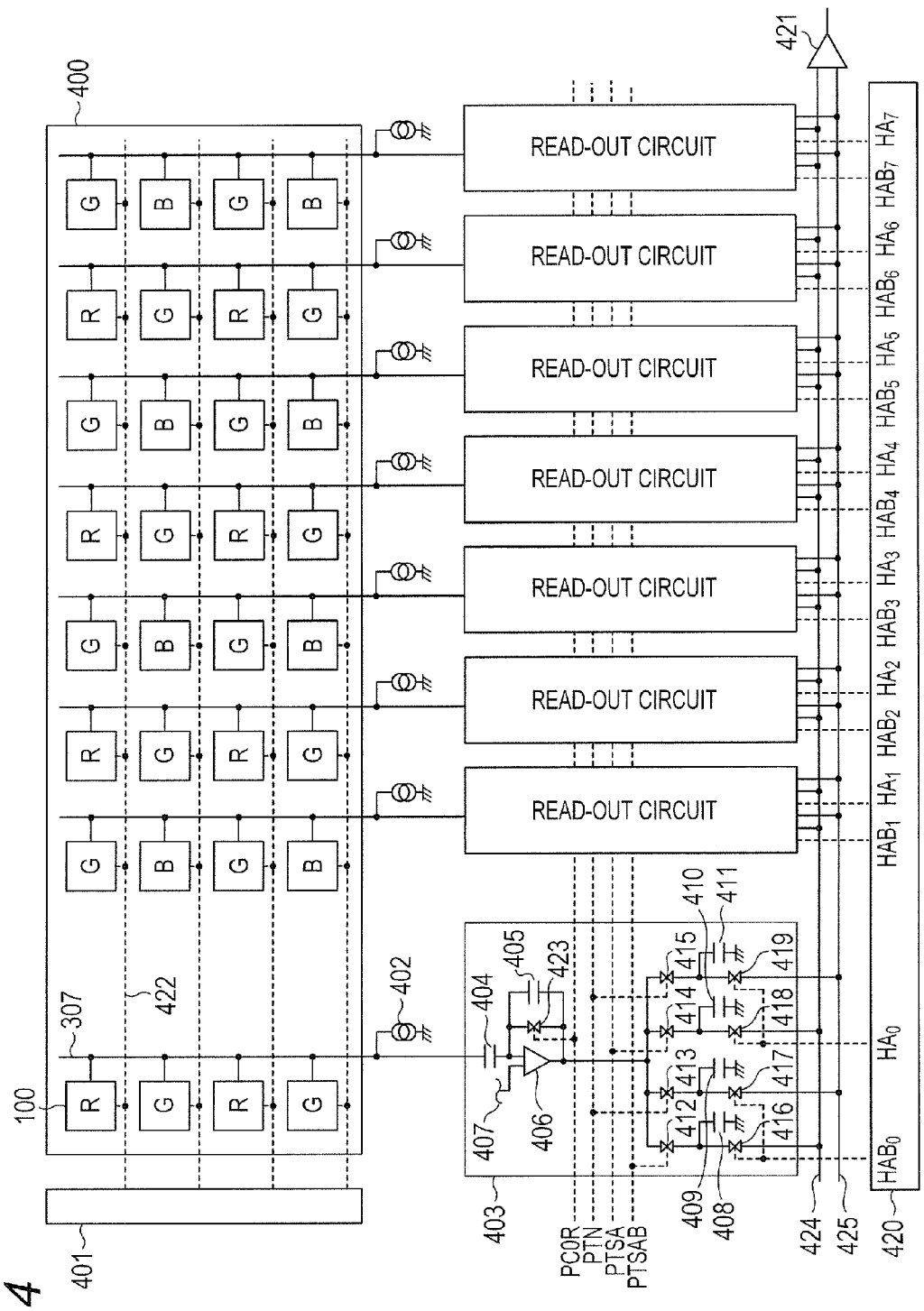
FIG. 4 is a circuit configuration diagram of a read-out circuit of the image pickup element in the image pickup apparatus according to the first embodiment of the present invention.

FIG. 4 is a circuit configuration diagram of a read-out circuit of the image pickup element in the image pickup apparatus according to the present embodiment. In FIG. 4, the same components as those in FIG. 1 or 3 are designated with the same reference numerals as the corresponding components in FIG. 1 or 3.

In a pixel area 400 of the image pickup element 201, the plural unit pixels 100 are arranged in a matrix form. Note that although a pixel area of 8×4 pixels is illustrated in FIG. 4 for simplicity of description, there are actually many more pixels. Also, color filters of plural colors are placed over the unit pixels 100. In FIG. 4, the pixel provided with a red color filter and configured to pick up red light is denoted by R, the pixel provided with a green color filter and configured to pick up green light is denoted by G, and the pixel provided with a blue color filter and configured to pick up blue light is denoted by B. The pixels provided with the color filters of the three colors are arranged in a Bayer array.

A vertical shift register 401 sends out a drive pulse through a drive signal line 422 which is common to all pixels in each row. Note that although the single drive signal line 422 is illustrated in each row for sake of simplicity, plural drive signal lines (control signal lines indicated by broken lines in FIG. 3) are actually connected to each row.

The unit pixels 100 in the same columns are connected to the common vertical output line 307 and the signal from each of the pixels is input to a common read-out circuit 403 via the vertical output line 307. Then, the signal processed by the read-out circuit 403 are output in sequence by a horizontal shift register 420 to an output amplifier 421 through horizontal output lines 424 and 425. Incidentally, a current-source load 402 is connected to the vertical output line 307.

Next, a circuit configuration of the read-out circuit 403 will be described.

The read-out circuit 403 includes a clamp capacitor C0 404, a feedback capacitor Cf 405, an operational amplifier 406, a reference voltage source 407 configured to supply a reference voltage Vref, and a switch 423 configured to throw a short circuit across the feedback capacitor Cf. The switch 423 is controlled by a PC0R signal. Capacitors 408, 409, 410 and 411 hold signal voltages, and are denoted by CTSAB, CTSA, CTN and CTN, respectively.

Switches 412, 413, 414 and 415 control writing into capacitors. The switch 412 is controlled by a PTAB signal and the switch 414 is controlled by a PTSA signal. The switches 413 and 415 are controlled by a PTN signal. Switches 416, 417, 418 and 419 are used to receive signals from the horizontal shift register 420 and to output signals to the output amplifier 421 through the horizontal output lines 424 and 425. The switches 416 and 417 are controlled by an HAB (n) signal of the horizontal shift register 420 while the switches 418 and 419 are controlled by an HA (n) signal, where n represents a column number in the read-out circuit to which the control signal line is connected. The signals written into the capacitors CTSAB 408 and CTSA 410 are output to the output amplifier 421 through the horizontal output line 424 while the signals written into the capacitors CTN 409 and CTN 411 are output to the output amplifier 421 through the horizontal output line 425. Signals PC0R, PTN, PTA, and PTAB are supplied from the timing generation unit 202 under the control of the overall control and computing unit 204.

Next, the drive configuration of the pixel signal read-out circuit illustrated in FIG. 4 will be described with reference to a drive timing chart of FIG. 5.

At time T=t1, the control signals PTXA and PTXB of the transfer switches 302A and 302B are set High (H) to reset the photodiodes 101A and 101B. At T=t2, PTXA and PTXB are set Low (L) to start accumulating photo-charges in the photodiodes 101A and 101B.

After the photo-charges are accumulated for a required time, the control signal PSEL for the selector switch 306 is set High at T=t3 to turn on the selector switch 306. The control signal PRES for the reset switch 305 is set Low at T=t4, thereby releasing the reset of the floating diffusion area 303. Consequently, the potential of the floating diffusion area 303 is read as a reset signal level to the vertical output line 307 through the amplification unit 304 and input to the read-out circuit 403.

A reset signal level is input to the read-out circuit 403 in a state in which the operational amplifier 406 buffers the output of reference voltage Vref (in a state in which PC0R is High and the switch 423 is ON).

Subsequently, PC0R is set Low at T=t5, and then PTN is set High at T=t6, turning on the switches 413 and 415, to write the output of Vref at T=t5 into the capacitors CTN 409 and CTN 411. Next, at T=t7, PTN is set Low, turning off the switch 413 and 415 and thereby finishing the writing.

Next, at T=t8, PTXA is set High, turning on the first transfer switch 302A, to transfer the photo-charge of the photodiode 101A to the floating diffusion area 303, and then PTXA is set Low at T=t9. Consequently, the charge accumulated in the photodiode 101A is read out to the floating diffusion area 303. Then, output corresponding to a change in the charge is read to the vertical output line 307 via the amplification unit 304 and the actuated selector switch 306 and supplied to the read-out circuit 403.

In the read-out circuit 403, a voltage is output from the operational amplifier 406, where an inversion gain according to the ratio of the clamp capacitor C0 404 to the feedback capacitor Cf 405 is applied to a change in the voltage.

To write this voltage into the capacitor CTSA 410, PTSA is changed from Low to High at T=t10, turning on the switch 414. Then, PTSA is changed from High to Low at T=t11, turning off the switch 414 and thereby finishing the writing.

Next, at T=t12, PTXA is set High again and PTXB is also set High at the same time, turning on the transfer switches 302A and 302B. Consequently, the photo-charges of both the photodiodes 101A and 101B are read out to the floating diffusion area 303. The charges read out are supplied to the read-out circuit 403 as in the case when only 301A is read out.

To write the voltage into the capacitor CTSAB, PTSAB is changed from Low to High at T=t14, turning on the switch 412. Then, PTSAB is changed from High to Low at T=t15, turning off the switch 412 and thereby finishing the writing.

Consequently, by obtaining a voltage difference between voltage signals written into the capacitors CTSAB 408 and CTN 409, an A+B signal which is the sum of output signals from the photodiodes 101A and 101B is obtained. The image A+B signal becomes a photographing image.

Also, by obtaining a voltage difference between the voltage signals written into the capacitors CTSA 410 and CTN 411, an image-A signal which is an output signal from the photodiode 101A is obtained. The image-A signal provides information about a light transmitted through part of the pupil of the photographing lens. Furthermore, by obtaining a difference between the image-A signal and image A+B signal, an image-B signal which is an output signal of the photodiode 101B is obtained. The image-B signal provides information about a light transmitted through a pupil area different from that related to the image-A signal, and two informations about the two lights provide distance information.

Referring back to FIG. 5, PRES is set High at T=t16 to reset the floating diffusion area 303.

Subsequently, between T=t17 and T=t18, the drive pulse HA (n) of the horizontal shift register 420 for each read-out circuit is changed in sequence from L to H to L. Consequently, the switches 418 and 419 are turned from OFF to ON to OFF. The signals held in the capacitors CTSA 410 and CTN 411 of the column for which the switches 418 and 419 are turned from OFF to ON to OFF are read to the horizontal output lines 424 and 425, respectively, and then output from the output amplifier 421 as a voltage difference. The voltage difference becomes the image-A signal. According to the present embodiment, the pixel columns for which the drive pulse HA (n) changes from L to H to L are the 2nd and 5th columns as illustrated in the drive timing chart of FIG. 5, where the 0th, 1st, 3rd, 4th, 6th and 7th columns remain Low. Therefore, the image-A signal is read out from the 2nd and 5th pixel columns.

Next, between T=t18 and T=t19, the drive pulse HAB (n) of the horizontal shift register 420 for each read-out circuit is changed in sequence from L to H to L. Consequently, the switches 416 and 417 are turned from OFF to ON to OFF. The signals held in the capacitors CTSAB 408 and CTN 409 of the column for which the switches 416 and 417 are turned from OFF to ON to OFF are read out to the horizontal output lines 224 and 225, respectively, and then output from the output amplifier 421 as a voltage difference. The voltage difference becomes the image A+B signal. According to the present embodiment, the drive pulse HAB (n) changes from L to H to L for all the columns as illustrated in the drive timing chart of FIG. 5. Therefore, image A+B signal is read out from all the columns.

The above actions are carried out in sequence for each row, and the reading of the image-A signal and image A+B signal is completed.

FIG. 6 is a diagram illustrating pixels read out in the operation of reading out the image-A signal and image A+B signal according to the present embodiment. In FIG. 6, shaded pixels are pixels from which signals are not read out. When the image-A signal is read out, pixel signals are output from the 2nd and 5th columns. On the other hand, when the image A+B signal is read out, pixel signals are output from all the columns. The image-B signal can be obtained from differences between the image-A signals and the image A+B signal at a position corresponding to the image-A signal. Thus, the use of the image-A signal and image-B signal enables focus detection operation.

Also, the pixel columns to be read out can be changed by causing the horizontal shift register 420 to change the columns to which the HA (n) pulse and HAB (n) pulse are output. According to the present embodiment, a read-out range of the image-A signal is changed depending on parameters which represent photographing conditions. Details thereof will be described next.

Figure 7A:
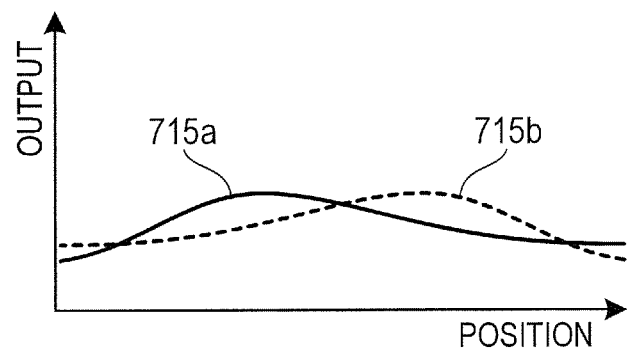
FIGS. 7A, 7B and 7C are diagrams illustrating image-A signal and image-B signal of an object according to a defocus amount during focus detection operation.
Figure 7B:
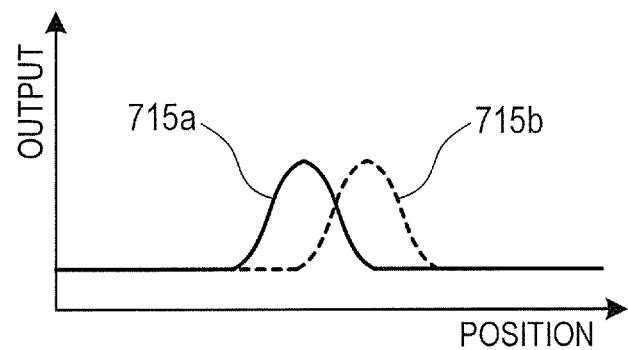
Figure 7C:
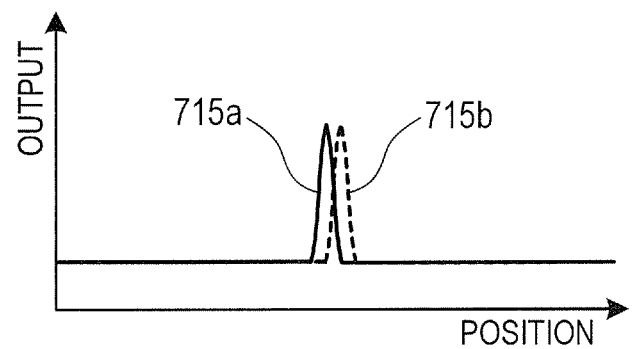

The image pickup apparatus according to the present invention performs focus detection based on the pupil division method using the light in the entire pupil area of the photographing lens. Consequently, the farther from an in-focus state, the more greatly an object image is deformed. FIGS. 7A to 7C are diagrams illustrating an image-A signal 715a and image-B 715b signal of an object with different defocus amounts during focus detection operation. The object image is deformed greatly as illustrated in FIG. 7A when the defocus amount is large, the object image is deformed moderately as illustrated in FIG. 7B when the defocus amount is moderate, and the object image is not deformed much as illustrated in FIG. 7C when the defocus amount is small. Therefore, to detect the focus when the defocus amount is large, it is necessary to acquire the image-A signal and image-B signal over a wide range.

Figure 8A:
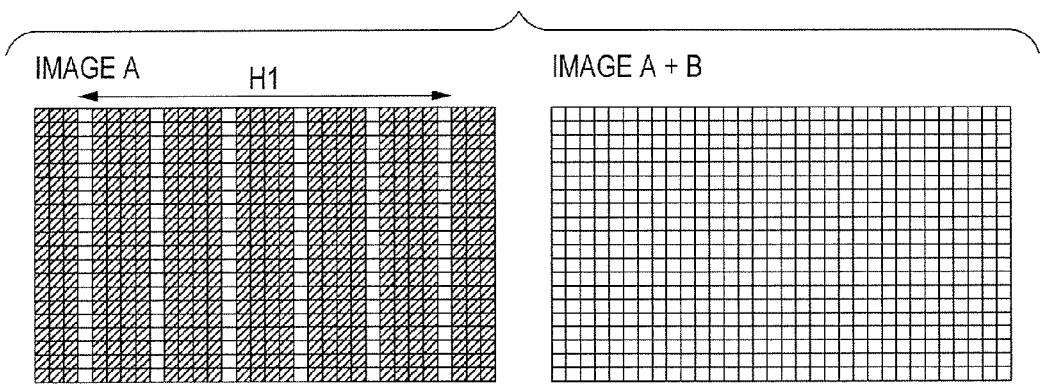
FIGS. 8A, 8B and 8C are diagrams illustrating read-out pixels corresponding to the defocus amount in the image pickup apparatus according to the first embodiment of the present invention.
Figure 8B:
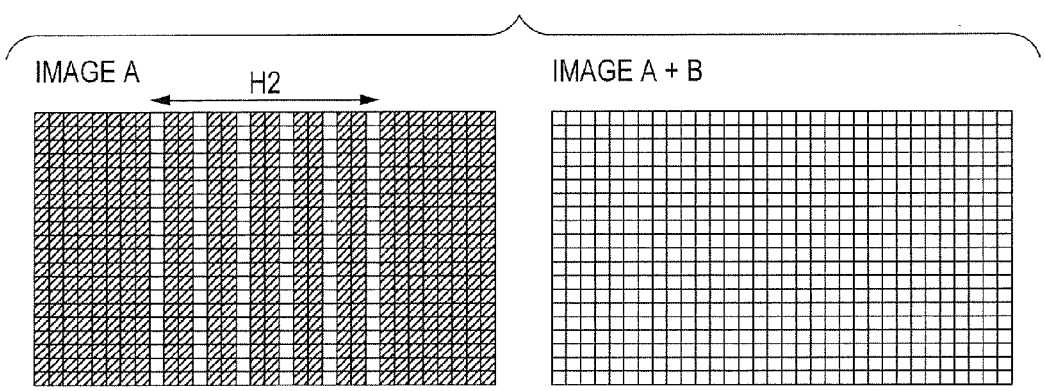
Figure 8C:
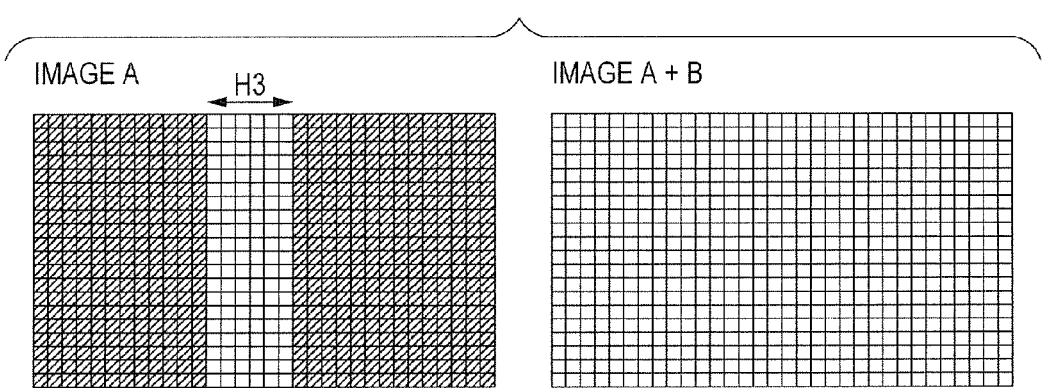

Thus, according to the present embodiment, the read-out range of the image-A signal as well as the thinning-out rate in the read-out range are changed depending on the defocus amount of the photographing lens, which is one of the parameters of photographing conditions, as illustrated in FIGS. 8A to 8C. Note that FIGS. 8A to 8C illustrate an example in which a pixel area contains 32×20 pixels, where signals are not read out from the shaded pixels.

First, when the defocus amount is large, as illustrated in FIG. 8A, the image-A signal is read out from a read-out range denoted by H1 at a thinning-out rate of ⅕ while the image A+B signal is read out from the entire area without thinning-out. When the defocus amount is moderate, as illustrated in FIG. 8B, the image-A signals is read out from a read-out range denoted by H2 at a thinning-out rate of ⅓ while the image A+B signal is read out from the entire area without thinning-out. When the defocus amount is small, as illustrated in FIG. 8C, the image-A signal is read out from a read-out range denoted by H3 without thinning-out while the image A+B signal is read out from the entire area without thinning-out. These read-out operations are set as read-out modes by the overall control and computing unit 204 according to the defocus amount and the horizontal shift register 420 changes the columns to which the HA (n) pulse and HAB (n) pulse are output, depending on the set read-out mode.

In FIGS. 8A to 8C, although the read-out range of the image-A signal differs among read-out modes as given by H1>H2>H3, since the thinning-out rate is varied at the same time, the number of the pixels to be read out remains unchanged. Thus, the read-out time also remains the same.

Figure 9:
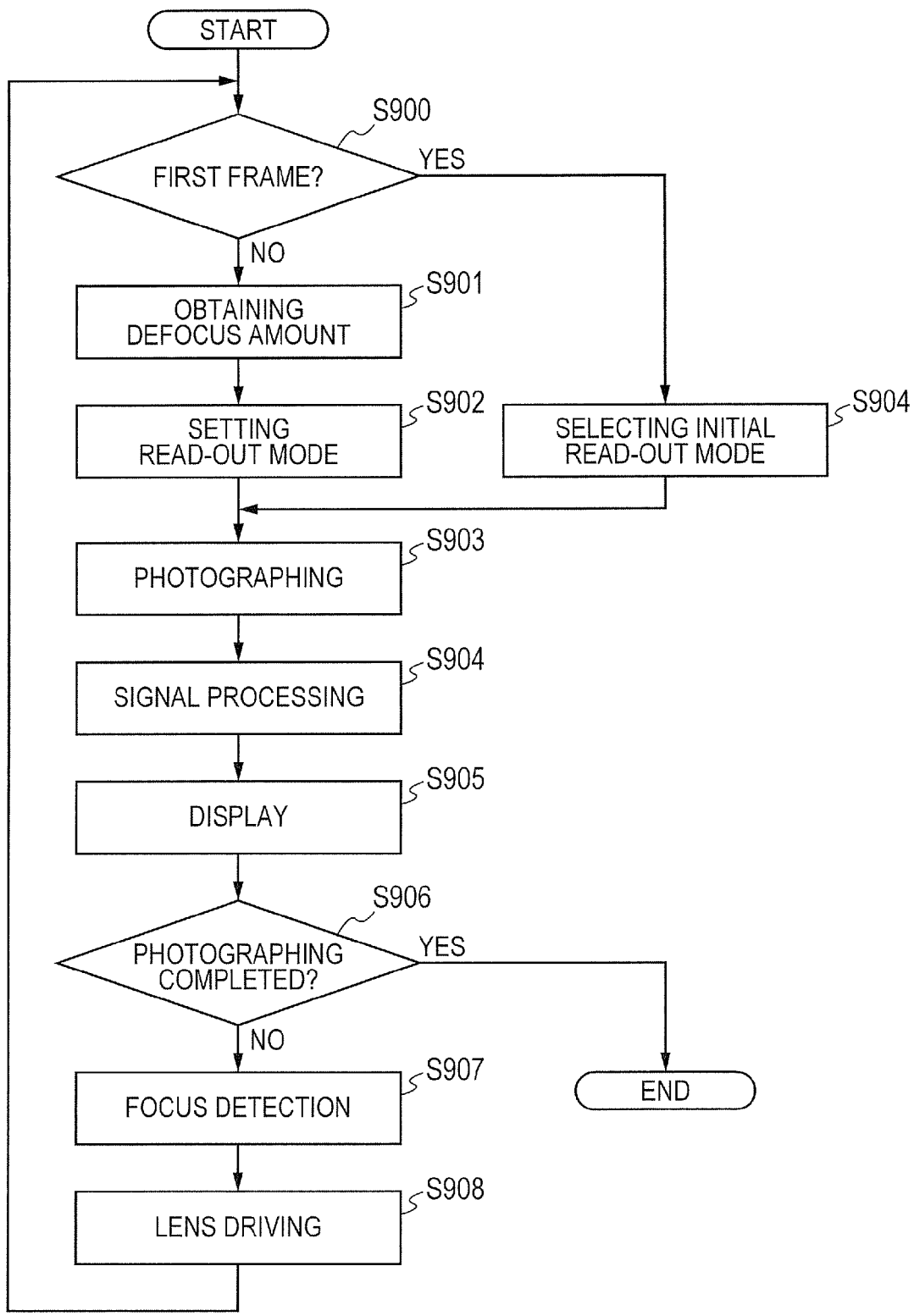
FIG. 9 is a diagram illustrating a flowchart of image pickup operation of the image pickup apparatus according to the first embodiment of the present invention.

FIG. 9 is a diagram illustrating a flowchart of image pickup operation of the above-described image pickup apparatus according to the present embodiment. The image pickup operation is implemented by a CPU (not illustrated) of the overall control and computing unit 204 loading and executing a program corresponding to the flowchart.

This operation is started when the operation unit 208 accepts a photographing start command issued by the user by operating the operation member (not illustrated) of the image pickup apparatus 200.

First, in step S900, the overall control and computing unit 204 determines whether the current frame is the first frame. If it is the first frame, the overall control and computing unit 204 goes to step S904 to set an initial read-out mode. In this case, since a defocus amount cannot be acquired, a mode for reading an image A over a wide range at a thinning-out rate of ⅕ is set as illustrated in FIG. 8A.

If it is determined in step S900 that the current frame is the second or later frame, the overall control and computing unit 204 goes to step S901. In step S901, the overall control and computing unit 204 acquires the defocus amount obtained for the previous frame. Next, in step 902, the overall control and computing unit 204 sets a read-out mode according to the defocus amount obtained in step S901.

Next, in step S903, the overall control and computing unit 204 acquires the image-A signal and image A+B signal by driving the image pickup element 201 in the read-out mode which is set, and then the signal processing unit 203 generates the image-B signal from the image-A signal and image A+B signal in step S904. In step S905, out of the acquired images, the image A+B signal is displayed as a photographing image on the display unit 206. In step S906, the overall control and computing unit 204 determines whether to finish photographing. If photographing is to be continued, the focus is adjusted, the lens is driven, and an image is acquired again. The determination as to whether to continue photographing is made based on whether the operation unit 208 accepts an action of the user performing on the operation member (not illustrated) of the image pickup apparatus 200.

In step S907, the overall control and computing unit 204 performs a known correlation operation using the image-A signal and image-B signal, calculates the defocus amount of the photographing lens from a phase difference (image shift amount) between the images, and determines a distance to drive the photographing lens based on the defocus amount. In step S908, the overall control and computing unit 204 drives the photographing lens 210 by controlling the lens drive unit 209 based on the determined distance.

Subsequently, the overall control and computing unit 204 returns to step S900 again. In this case, since it is determined in step S900 that the current frame is the second or later frame, in step S901, the overall control and computing unit 204 acquires the defocus amount of the previous frame calculated in step S907. Then, in step S902, the overall control and computing unit 204 sets one of the read-out modes illustrated in FIGS. 8A to 8C based on the acquired defocus amount, and then takes a photograph in the selected read-out mode in step S903.

Consequently, even if there is a large defocus amount so that the object image is deformed greatly, the focus can be detected if a focus detection signal is acquired over a wide range. Also, around an in-focus position, a focus detection signal is acquired by reading out signals without thinning-out. This enables accurate focusing. Also, since a read-out area of the image-A signal is limited, the read-out time can also be reduced compared to when the image-A signal is read out from the entire pixel area. Furthermore, since the image A+B signal is always read out from the entire pixel area, image quality deterioration of the photographing image does not occur.

First Modification of First Embodiment

Next, a first modification of the above-described first embodiment will be described with reference to FIGS. 10 to 12. In the first embodiment, the read-out range of the image-A signal is changed according to the defocus amount, the image-A signals in the read-out area are thinned out at a rate of ⅓ or ⅕, and the image A+B signal is read out from the entire pixel area. In the present modification, other examples of read-out modes will be described. Pixel selection in the read-out modes according to the present modification is also implemented by a read-out circuit (FIG. 4) of the first embodiment. Thus, in the present modification, only the read-out modes in the pixel area will be described.

Figure 10:
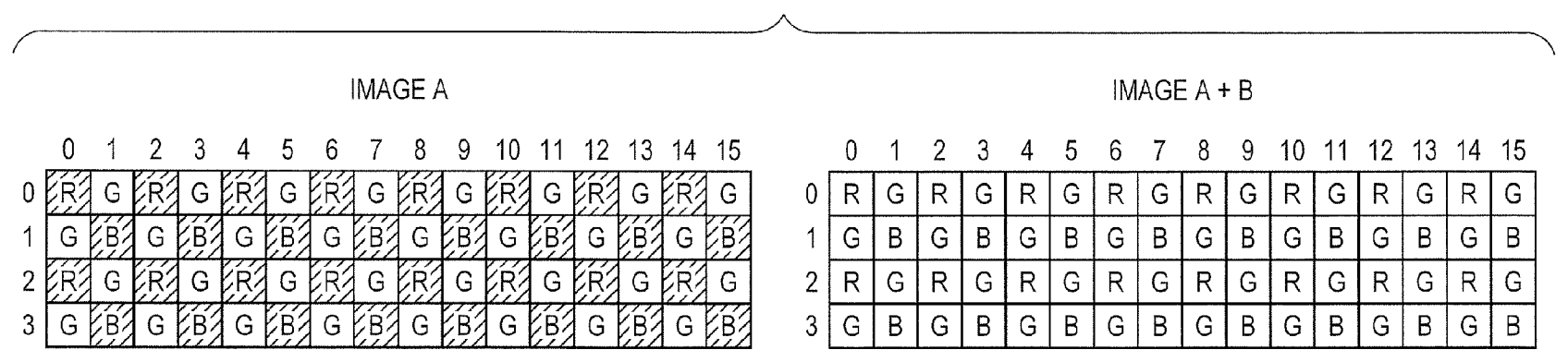
Figure 11:
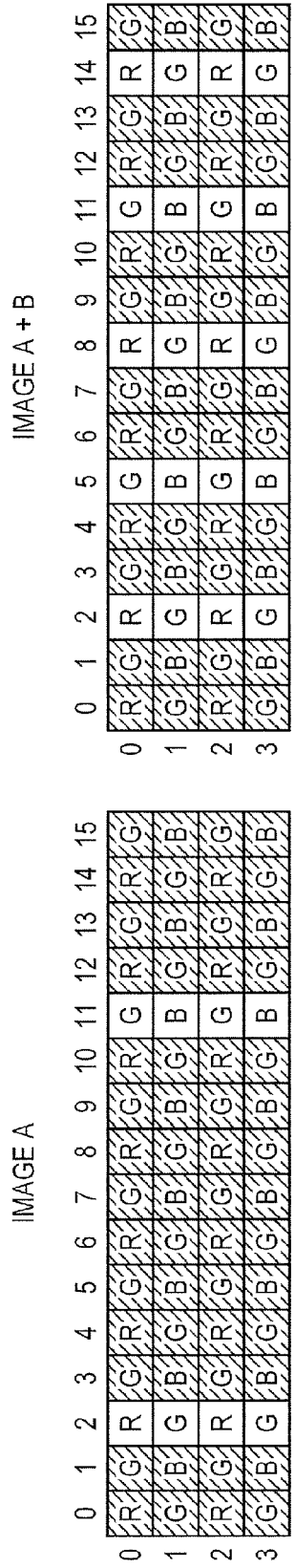
FIG. 11 is a diagram illustrating another example of read-out pixels according to the first modification of the first embodiment of the present invention.
Figure 12:
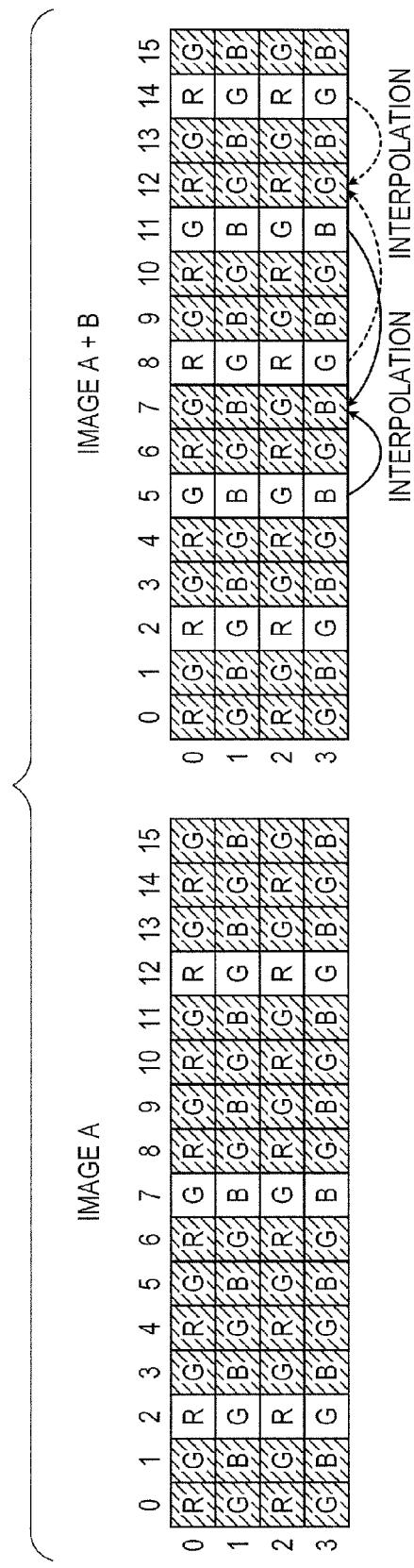
FIG. 12 is a diagram illustrating still another example of read-out pixels according to the first modification of the first embodiment of the present invention.

FIGS. 10 to 12 illustrate an example of the read-out modes according to the present modification. In FIGS. 10 to 12, the pixel area contains 16×4 pixels, where signals are not read out from the shaded pixels. Pixel selection in these read-out modes can be implemented by changing the pixel columns to which the HA (n) pulse and HAB (n) pulse are output in the set read-out mode from the horizontal shift register 420 of the read-out circuit according to the first embodiment.

FIG. 10 illustrates pixel read-out settings in a read-out mode in which only the pixel signals of a predetermined color are read out in reading the image-A signal and all the pixels are always read out in reading the image A+B signal. Based on the pixel read-out settings, in reading even-numbered rows (0th, 2nd, . . . rows in FIG. 10), the horizontal shift register 420 sends out an HA (n) pulse only to odd-numbered columns (1st, 3rd, . . . , columns in FIG. 10) and sends out an HAB (n) pulse to all the columns. On the other hand, in reading odd-numbered rows (1st, 3rd, . . . , rows in FIG. 10), the horizontal shift register 420 sends out an HA (n) pulse only to even-numbered columns (0th, 2nd, . . . columns in FIG. 10) and sends out an HAB (n) pulse to all the columns. As a result of the read-out operations, only G pixels are output in reading the image-A signal and all the pixels are output for the A+B signal. By obtaining differences between the image-A signal to be output and the image A+B signal at a position corresponding to the image-A signal, the image-B signal is obtained, thereby enabling focus detection using G pixels alone.

FIG. 11 is an example of a read-out mode setting in which also image A+B signal is read out by thinning out columns to achieve faster read-out. In this setting example, columns 2, 5, 8, 11 and 14 are read out to read the image A+B signal at a thinning-out rate of ⅓, and the columns read out for the image A+B signal are further thinned out at a rate of ½ to read the image-A signal only from columns 2 and 11 in FIG. 11. Even if the image A+B signal is read out by thinning out columns, since that part of the image A+B signal which corresponds to the image-A signal is read out without fail, image-B signal is generated.

FIG. 12 is an example of a read-out mode setting in which the image A+B signal is read out at a thinning-out rate of ⅓, and the image-A signal is read out at a thinning-out rate of ⅕. In this case, unlike the example of FIG. 11, some of the columns at a position corresponding to the image-A signal are not read out in reading the image A+B signal. However, of the image A+B signal, the missing pixel signals at a position corresponding to the image-A signal can be generated by interpolating using pixel signals of the same colors available from adjacent columns. For example, of the image A+B signal, the image A+B signal corresponding to the image-A signal of the G pixel in the 0th row 7th column in FIG. 12 is interpolated from the image A+B signal of the G pixel in the 0th row 5th column and the G pixel in the 0th row 11th column. This allows the image-B signal to be generated even if that part of the image A+B signal which corresponds in position to the image-A signal is not read out.

Second Modification of First Embodiment

In the first embodiment and first modification thereof, since the image-A signal is read out by thinning out columns, image-A signal information of the thinned-out columns is lost. According to the present modification, for example, before the image-A signal according to the first embodiment are read out, the image-A signal in a predetermined number of different columns are arithmetically averaged. Consequently, even if the number of columns to be read out as well as the read-out time is reduced as in the case of the first embodiment, the image-A signal information is obtained from a larger number of columns, so that the accuracy of focus detection can be improved. An image pickup apparatus according to the present modification differs from the image pickup apparatus 200 according to the first embodiment only in the configuration of the read-out circuit of the image pickup element 201. Components other than the read-out circuit are similar to the first embodiment, and thus description thereof will be omitted here.

Figure 13:
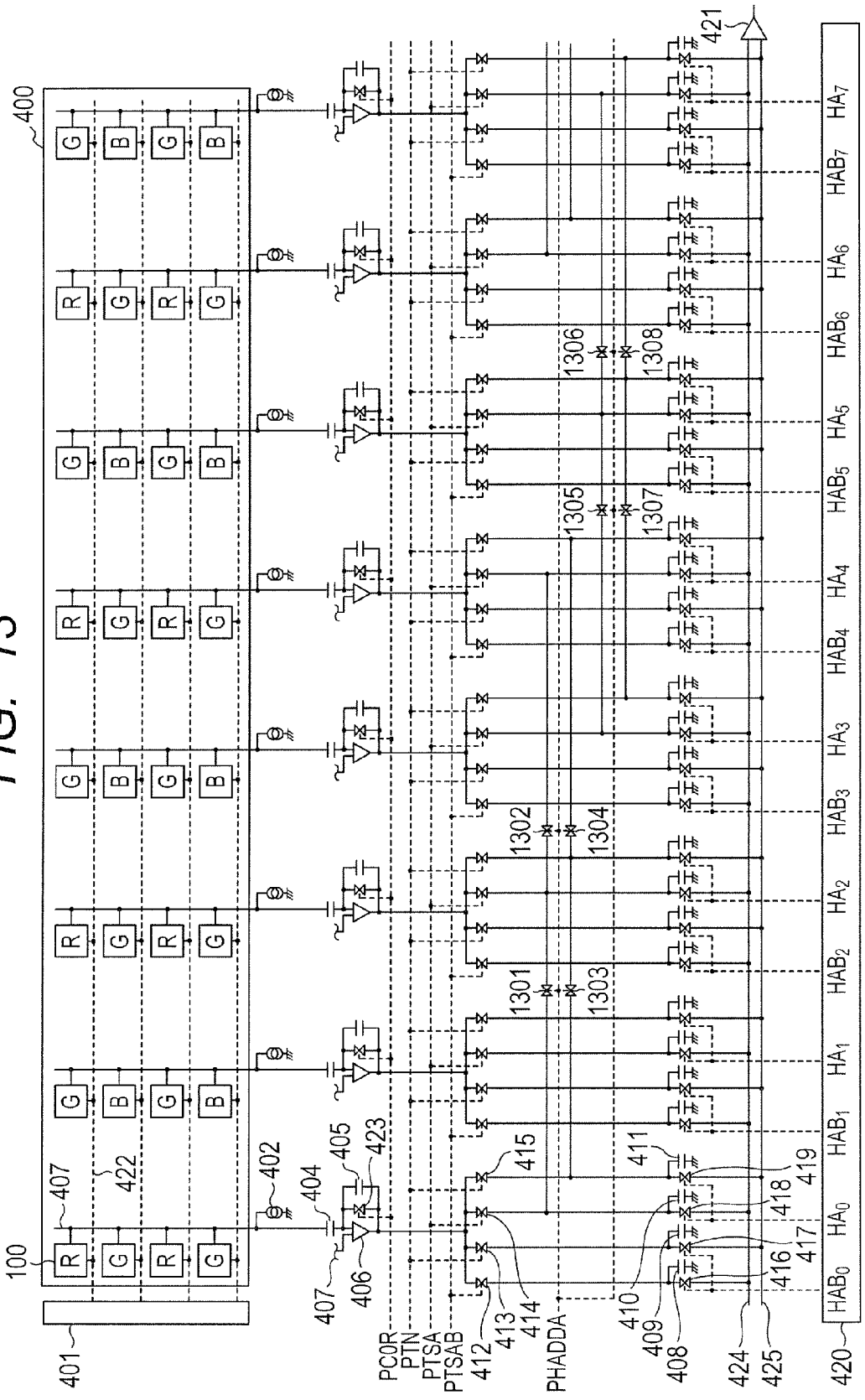
FIG. 13 is a circuit configuration diagram of a read-out circuit of an image pickup element in an image pickup apparatus according to a second modification of the first embodiment of the present invention.

FIG. 13 is a circuit configuration diagram of the read-out circuit in the image pickup apparatus according to the second modification of the first embodiment. In FIG. 13, components having the same functions as those in FIG. 4 are denoted with the same reference numerals as the corresponding components in FIG. 4, and description thereof will be omitted.

Switches 1301 to 1308 are used to interconnect the capacitors CTSA 414 and CTN 415 for a predetermined number (three in FIG. 13) of adjacent columns of the same pixel color arrangement and are controlled by a PHADDA pulse. When the switches 1301 and 1302 are turned on and then off, an arithmetically-averaged voltage of the voltages held on the capacitors CTSA 410 of the 0th, 2nd and 4th columns is written into the capacitors CTSA 410. Also, when the switches 1303 and 1304 are turned on and then off, an arithmetically-averaged voltage of the voltages held on the capacitors CTN 411 of the 0th, 2nd and 4th columns is written into the capacitors CTN 411. Similarly, the switches 1305 and 1306 are used to arithmetically average the voltages held on the capacitors CTSA 410 of the 3rd, 5th and 7th columns while the switches 1307 and 1308 are used to arithmetically average the voltages held on the capacitors CTN 411 of the 3rd, 5th and 7th columns.

Figure 5:
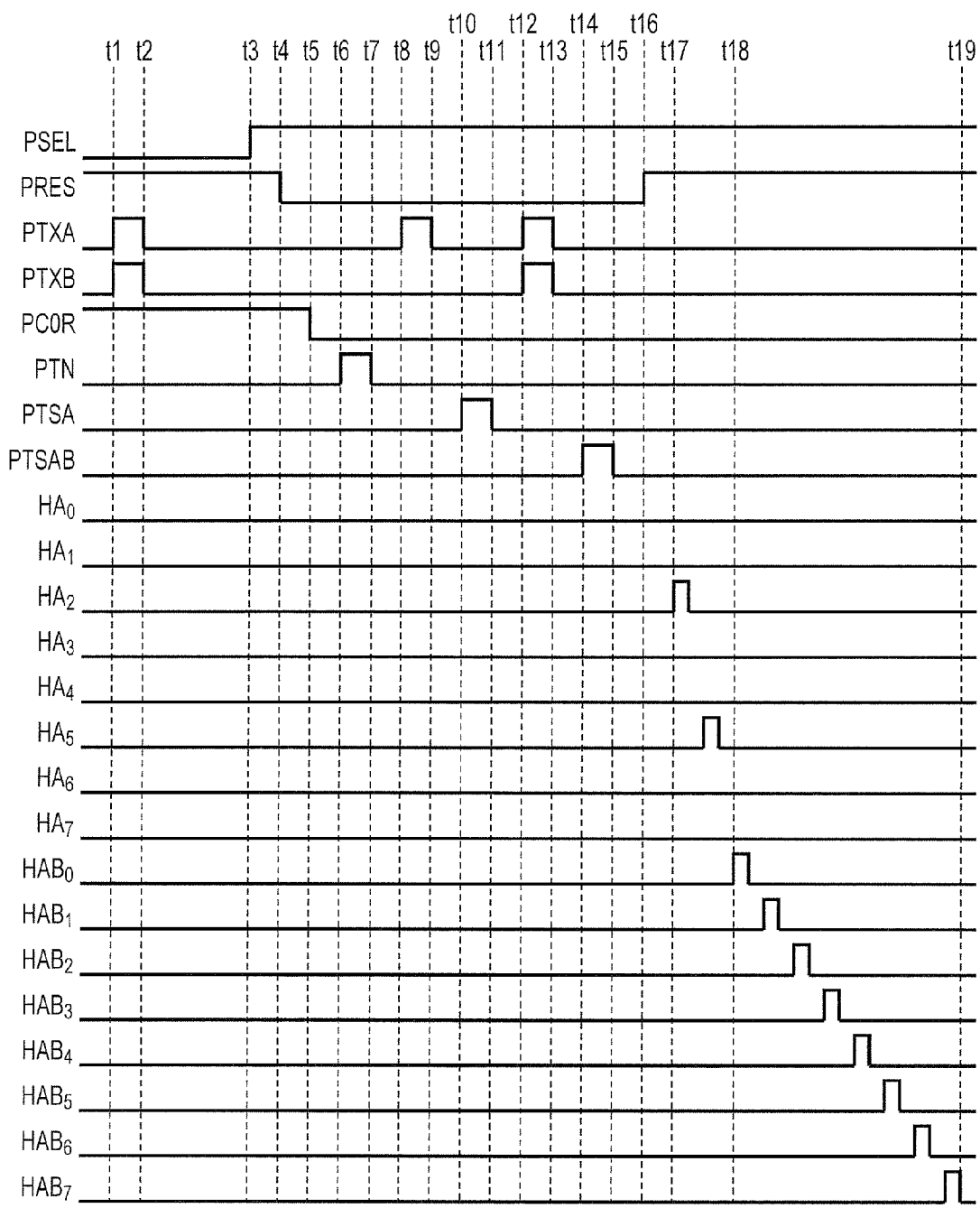
FIG. 5 is a diagram illustrating a drive timing chart of the image pickup element in the image pickup apparatus according to the first embodiment of the present invention.
Figure 14:
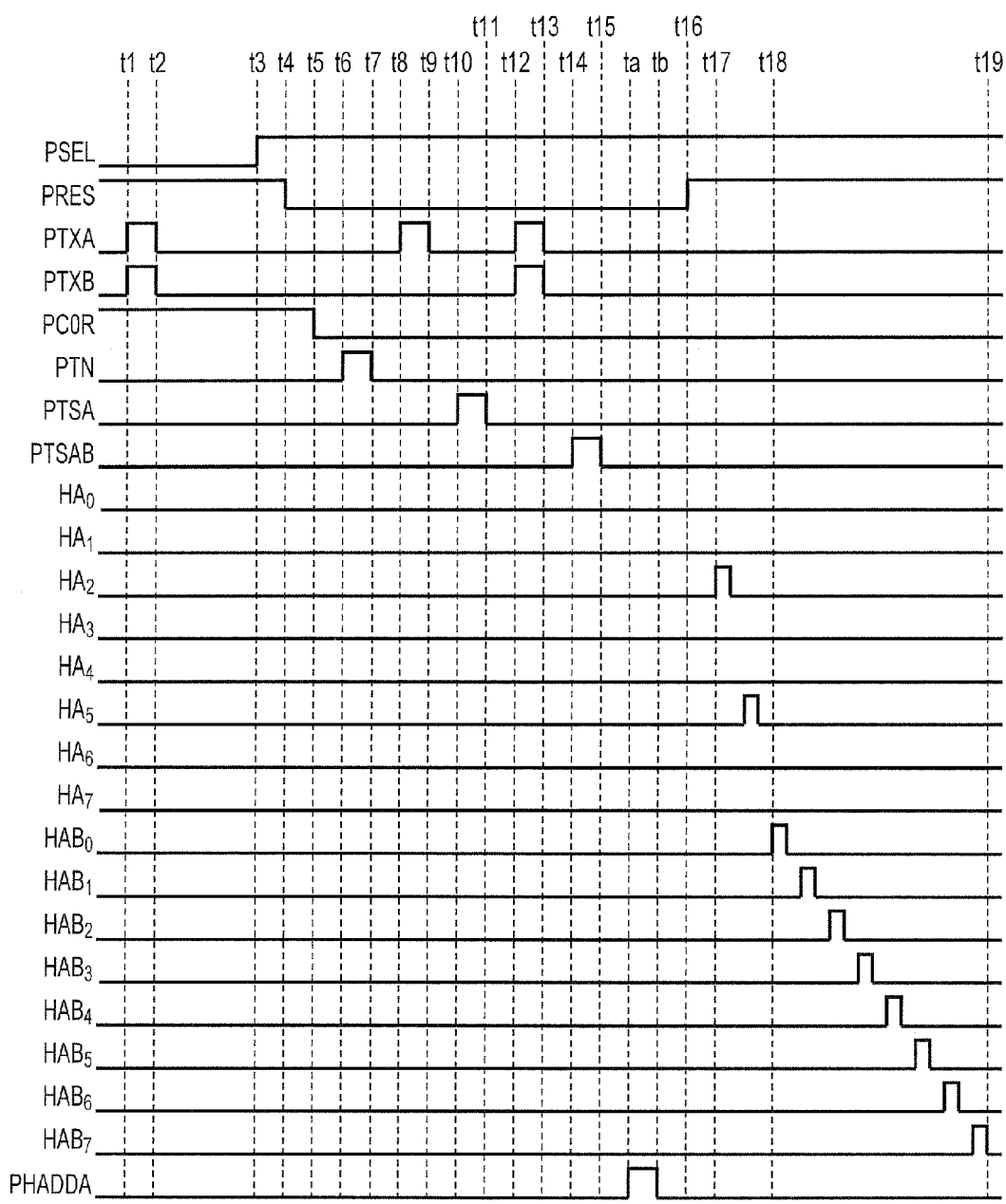
FIG. 14 is a diagram illustrating a drive timing chart of the image pickup element in the image pickup apparatus according to the second modification of the first embodiment of the present invention.

FIG. 14 is a diagram illustrating a drive timing chart according to the present embodiment, in which the same components as those in FIG. 5 are denoted with the same reference numerals as the corresponding components in FIG. 5, and description thereof will be omitted.

FIG. 14 differs from FIG. 5 in that the PHADDA pulse is changed from L to H to L between T=ta and T=tb. Consequently, the voltages written into the capacitors CTSA 410 and CTN 411 of a predetermined number of adjacent columns of the same pixel color arrangement are arithmetically averaged. Subsequently, the image-A signal is read out from the 2nd and 5th columns while the image A+B signal is read out from all the columns by sending out the HA (n) pulses and HAB (n) pulses in a manner similar to the first embodiment in FIG. 5.

Pixel positions to be read by this read-out operation are the same as in FIG. 6, but as the image-A signal, an arithmetically-averaged signal of adjacent pixels of the same color is read out.

Note that to calculate the image B signal from the image-A signal and image A+B signal, the image-A signal is subtracted from an arithmetic average of the image A+B signal of adjacent pixels of the same color.

The above operation prevents omission of image-A signal information of the columns that are read out, thereby improving the accuracy of focus detection.

Also, examples of pixel read-out settings are not limited to the first embodiment and first modification thereof described above, and other settings may be used, as appropriate, instead of or in addition to the above settings.

Second Embodiment

Next, a second embodiment of the present invention will be described.

As described earlier, the image pickup apparatus according to the present invention performs focus detection based on the pupil division method using the light in the entire pupil area of the photographing lens. Therefore, the wider the aperture of the photographing lens, the more greatly an object image is deformed in the case of defocus.

Figure 15A:
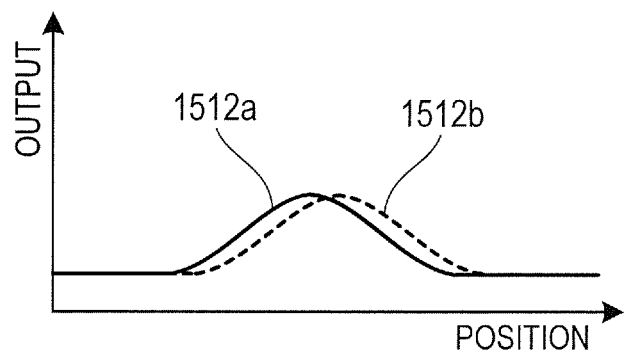
FIGS. 15A, 15B and 15C are diagrams illustrating image-A signal and image-B signal of an object corresponding to an aperture of a photographing lens during focus detection operation.
Figure 15B:
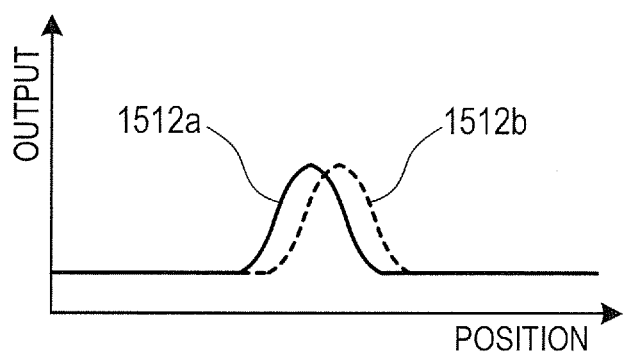
Figure 15C:
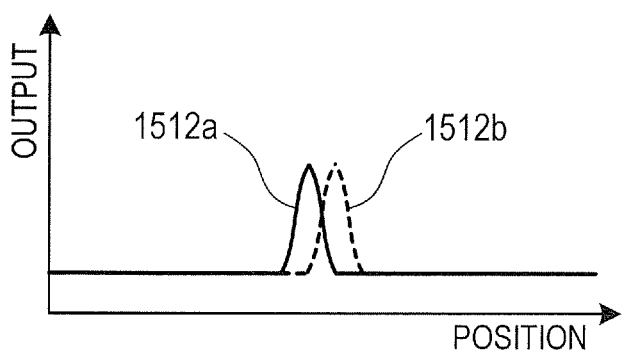

FIGS. 15A to 15C are diagrams for illustrating a relationship between an image-A signal 1512a and image-B signal 1512b of a defocused object and an aperture value of a photographing lens during focus detection operation. On the small-aperture side on which the aperture value of a photographing lens is large, the object image is not deformed much as illustrated in FIG. 15C, but the deformation of the object image increases as the aperture widens from an intermediate aperture illustrated in FIG. 15B to the full aperture illustrated in FIG. 15A. Therefore, in order to detect the focus on the full-aperture side on which the aperture value is small, it is necessary to acquire the image-A signal and image-B signal over a wide range.

Thus, according to the present embodiment, a read-out mode for changing the read-out range of image A as well as the thinning-out rate in the read-out range is set as illustrated in FIGS. 8A to 8C according to the aperture value of the photographing lens, which is another parameter of photographing conditions. At the full aperture, as illustrated in FIG. 8A, the image A is read out from a read-out range denoted by H1 at a thinning-out rate of ⅓ while the image A+B is read out from the entire area without thinning out. At an intermediate aperture, as illustrated in FIG. 8B, the image A is read out from a read-out range denoted by H2 at a thinning-out rate of ⅓ while the image A+B is read out from the entire area without thinning out. At a small aperture, as illustrated in FIG. 8C, the image A is read out from a read-out range denoted by H3 without thinning out while the image A+B is read out from the entire area without thinning out.

Figure 16:
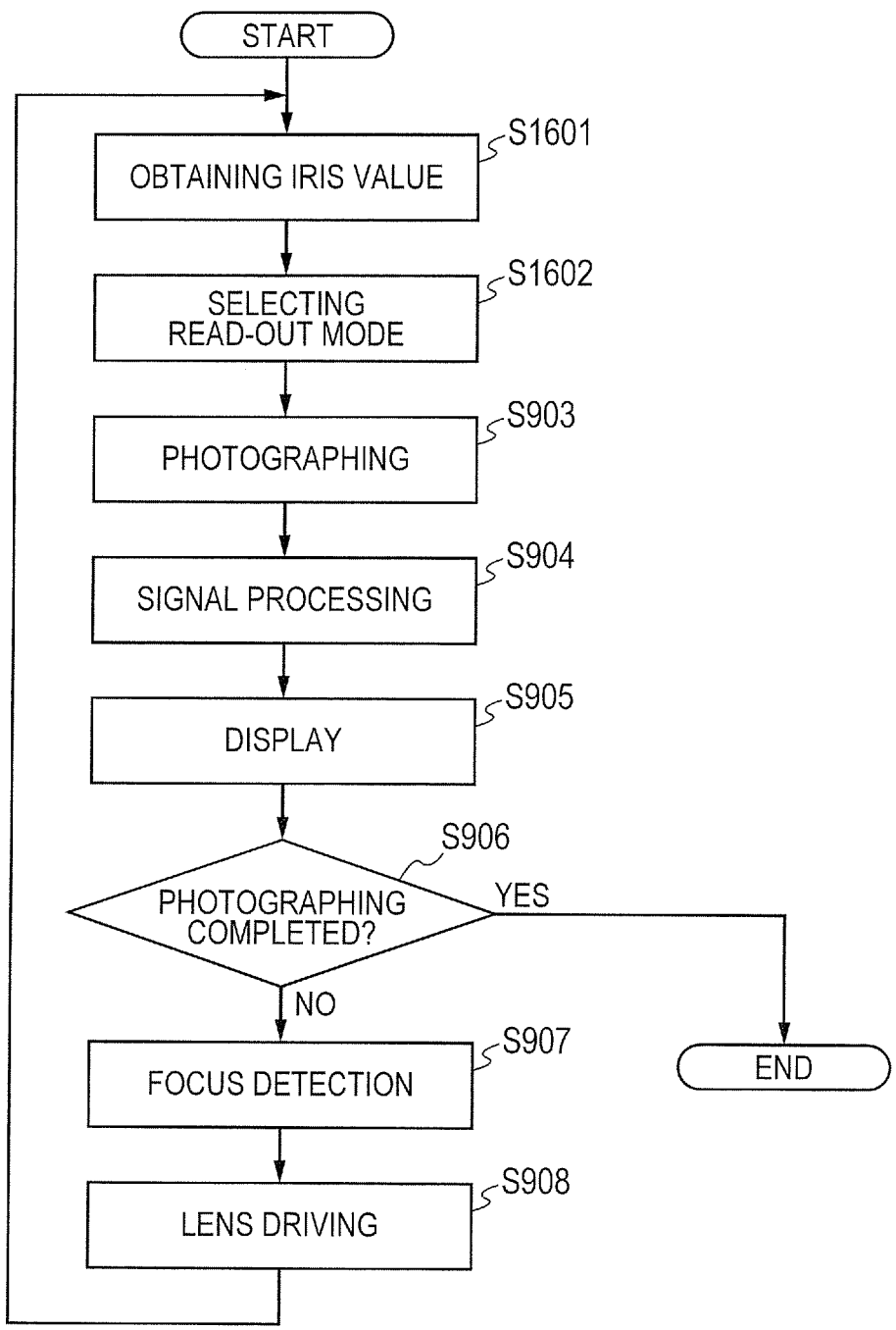
FIG. 16 is a diagram illustrating a flowchart of image pickup operation of an image pickup apparatus according to a second embodiment of the present invention.

FIG. 16 is a diagram illustrating a flowchart of image pickup operation of the image pickup apparatus according to the present embodiment. In FIG. 16, the same components as those of the first embodiment are denoted with the same reference numerals as the corresponding components of the first embodiment, and description thereof will be omitted.

When photographing starts, first, the aperture value of the photographing lens is acquired in step S1601. Next, in step S1602, one of the read-out modes in FIGS. 8A to 8C is selected according to the acquired aperture value. Next, in step S903, the image-A signal and image A+B signal are acquired in the selected read-out mode. Subsequent operations are similar to those of the first embodiment.

The above operation allows an optimal read-out range of image A to be set according to the aperture value of the photographing lens and allows increases in read-out time to be suppressed when reading out an image A according to the setting.

The invention described above allows an image pickup apparatus capable of focus detection based on the pupil division method to obtain a focus detection signal of an optimal range in accordance with a photographing condition while suppressing increases in signal read-out time.

Another Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-238000, filed Oct. 29, 2012, which is hereby incorporated by reference herein in its entirety.

What is claimed is:

1. An image pickup apparatus comprising:
   an image pickup unit in which a plurality of photoelectric conversion elements are provided correspondingly to each of microlenses arranged two-dimensionally;
   a read-out unit configured to read out a first signal through addition from the plurality of photoelectric conversion elements corresponding to the microlense, and read out a second signal from one of the plurality of photoelectric conversion elements corresponding to the microlense; and
   a setting unit configured to set one of a first read-out mode and a second read-out mode in order for the read-out unit to read signals from the image pickup unit in accordance with a photographing condition,
   wherein the first read-out mode and the second read-out mode differ in read-out density of the second signal in a read-out area in accordance with one of a thinning-out rate and an addition rate of an area from which the second signal is read out being different as compared to an area from which the first signal is read out, and
   wherein the setting unit sets the read-out mode according to a defocus amount.

2. The image pickup apparatus according to claim 1, wherein the first read-out mode and the second read-out mode differ from each other in the thinning-out rate of columns from which the second signal is read out.

3. The image pickup apparatus according to claim 1, wherein the first read-out mode and the second read-out mode differ from each other in the addition rate of columns from which the second signal is read out.

4. The image pickup apparatus according to claim 1, further comprising a signal processing unit configured to generate a third signal corresponding to the second signal using the first signal and the second signal from the image pickup unit.

5. The image pickup apparatus according to claim 4, wherein the signal processing unit calculates a defocus amount from the second signal and the third signal.

6. The image pickup apparatus according to claim 1, wherein an exit pupil of a photographing lens is divided by the microlen and the plurality of photoelectric conversion elements corresponding to the microlen.

7. The image pickup apparatus according to claim 1, wherein the first read-out mode and the second read-out mode differ from each other in a range and the thinning-out rate of both a pixel from which a pixel signal of predetermined photoelectric conversion element is read out and a pixel from which the first signal is read out.

8. The image pickup apparatus according to claim 1, wherein the setting unit sets the read-out mode according to an aperture value, and wherein, when the aperture value is a second value smaller than a first value, the setting unit expands a selection range of the pixel from which the pixel signal of predetermined photoelectric conversion element is read out.

9. The image pickup apparatus according to claim 1, wherein the larger the defocus amount, the larger the setting unit sets the selection range of the pixel from which the pixel signal of predetermined photoelectric conversion element is read out.

10. The image pickup apparatus according to claim 1, wherein:
the image pickup unit includes color filters of plural colors arranged on the respective pixels; and
the setting unit sets the range and the thinning-out rate such that the pixel from which the pixel signal of predetermined photoelectric conversion element is read out is provided with color filter of a same color.

11. The image pickup apparatus according to claim 4, wherein the signal processing unit interpolates a pixel signal of photoelectric conversion element different from predetermined photoelectric conversion element included in the pixel from which the pixel signal of the predetermined photoelectric conversion element selected in the read-out mode.

12. The image pickup apparatus according to claim 11, wherein the signal processing unit generates a third signal from the interpolated first signal and the second signal.

13. The image pickup apparatus according to claim 11, wherein photoelectric conversion area which output the signal used for the interpolation is provided with a color filter of a same color as photoelectric conversion area which outputs the second signal.

14. The image pickup apparatus according to claim 1, wherein the read-out unit includes an arithmetically averaging unit configured to arithmetically-average pixel signals of photoelectric conversion elements of pixels in a plurality of predetermined columns of a pixel array and reads out a signal resulting from the arithmetic averaging as the second signal in the read-out mode.

15. A control method for an image pickup apparatus equipped with an image pickup unit in which a plurality of photoelectric conversion elements are provided correspondingly to each of microlenses arranged two-dimensionally, the control method comprising:

reading out a first signal through addition from the plurality of photoelectric conversion elements corresponding to the microlense, and reading out a second signal from one of the plurality of photoelectric conversion elements corresponding to the microlense; and setting one of a first read-out mode and a second read-out mode in order to read signals from the image pickup unit in accordance with a photographing condition, wherein the first read-out mode and the second read-out mode differ in read-out density of the second signal in a read-out area in accordance with one of a thinning-out rate and an addition rate of an area from which the second signal is read out being different as compared to an area from which the first signal is read out, and wherein the setting unit sets the read-out mode according to a defocus amount.

16. A non-transitory computer-readable storage medium storing a program comprising a program code for causing a computer to execute the control method according to claim 15.

17. A control method of an image pickup apparatus comprising:

an image pickup unit in which a plurality of photoelectric conversion elements are provided correspondingly to each of microlenses arranged two-dimensionally, the control unit comprising:

reading out a first signal through addition from the plurality of photoelectric conversion elements corresponding to the microlense, and reading out a second signal from one of the plurality of photoelectric conversion elements corresponding to the microlense; and setting one of first read-out mode and a second read-out mode in order for the read-out in order to read signals from the image pickup unit in accordance with a photographing condition, wherein the first read-out mode and the second read-out mode differ in read-out density of the second signal in a read-out area in accordance with one of a thinning-out rate and an addition rate of an area from which the second signal is read out being different as compared to an area from which the first sign is read out, and wherein the setting unit sets the read-out mode according to an aperture value.

18. An image pickup apparatus comprising:

an image pickup unit in which a plurality of photoelectric conversion elements are provided correspondingly to each of microlenses arranged two dimensionally;

a read-out unit configured to read out a first signal through addition from the plurality of photoelectric conversion elements corresponding to the microlense, and read out a second signal from one of the plurality of photoelectric conversion elements corresponding to the microlense; and a setting unit configured to set one of a first read-out node and a second read-cut mode in order for the read-out unit to read signals from the image pickup unit in accordance with a. photographing condition, wherein the first read-out mode and the second read-out mode differ in read-out density of the second signal in a read-out area in accordance with one of a thinning-out rate and an addition of an area from which the second signal is read out being different as compared to an area from which the first signal is read out, and wherein the setting unit sets the range and the thinning-out rate such that the pixel from which the pixel signal of predetermined photoelectric conversion element is read out is included in the pixels from which the first signal is read out.

19. The image pickup apparatus according to claim 18, wherein the first read-out mode and the second read-out mode differ from each other in the thinning-out rate of columns from which the second signal is read out.

20. The image pickup apparatus according to claim 18, wherein the first read-out mode and the second read-out mode differ from each other in the addition rate of columns from which the second signal is read out.

21. The image pickup apparatus according to claim 18, further comprising a signal processing unit configured to generate a third signal corresponding to the second signal using the first signal and the second signal from the image pickup unit.

22. The image pickup apparatus according to claim 21, wherein the signal processing unit calculates a defocus amount from the second signal and the third signal.

23. The image pickup apparatus according to claim 18, wherein an exit pupil of a photographing lens is divided by the microlen and the plurality of photoelectric conversion elements corresponding to the microlen.

24. The image pickup apparatus according to claim 18, wherein the first read-out mode and the second read-out mode differ from each other in a range and the thinning-out rate of both a pixel from which a pixel signal of predetermined photoelectric conversion element is read out and a pixel from which the first signal is read out.

25. The image pickup apparatus according to claim 18, wherein the setting unit sets the read-out mode according to an aperture value, and wherein, when the aperture value is a second value smaller than a first value, the setting unit expands a selection range of the pixel from which the pixel signal of predetermined photoelectric conversion element is read out.

26. The image pickup apparatus according to claim 18, wherein the larger the defocus amount, the larger the setting unit sets the selection range of the pixel from which the pixel signal of predetermined photoelectric conversion element is read out.

27. The image pickup apparatus according to claim 18, wherein:
the image pickup unit includes color filters of plural colors arranged on the respective pixels; and
the setting unit sets the range and the thinning-out rate such that the pixel from which the pixel signal of predetermined photoelectric conversion element is read out is provided with color filter of a same color.

28. The image pickup apparatus according to claim 27, wherein the signal processing unit interpolates a pixel signal of photoelectric conversion element different from predetermined photoelectric conversion element included in the pixel from which the pixel signal of the predetermined photoelectric conversion element selected in the read-out mode.

29. The image pickup apparatus according to claim 28, wherein the signal processing unit generates a third signal from the interpolated first signal and the second signal.

30. The image pickup apparatus according to claim 28, wherein photoelectric conversion area which output the signal used for the interpolation is provided with a color filter of a same color as photoelectric conversion area which outputs the second signal.

31. The image pickup apparatus according to claim 18, wherein the read-out unit includes an arithmetically averaging unit configured to arithmetically-average pixel signals of photoelectric conversion elements of pixels in a plurality of predetermined columns of a pixel array and reads out a signal resulting from the arithmetic averaging as the second signal in the read-out mode.

32. A control method of an image pickup apparatus comprising:
an image pickup unit in which a plurality of photoelectric conversion elements are provided correspondingly to each of microlenses arranged two-dimensionally, the control unit comprising:
reading out a first signal through addition from the plurality of photoelectric conversion elements corresponding to the microlense, and reading out a second signal from one of the plurality of photoelectric conversion elements corresponding to the microlense; and setting one of a first read-out mode and a second read-out mode in order for the read-out in order to read signals from the image pickup unit in accordance with a photographing condition,
wherein the first read-out mode and the second read-out mode differ in read-out density of the second signal in a read-out area in accordance with one of a thinning-out rate and an addition of an area from which the second signal is read out being different as compared to an area from which the first signal is read out, and wherein the setting unit sets the range and the thinning-out rate such that the pixel from which the pixel signal of predetermined photoelectric conversion element is read out is included in the pixels from which the first signal is read out.

33. An image pickup apparatus comprising:
an image pickup unit having a plurality of image pick up elements arranged two-dimensionally, each of image pick up elements having a plurality of photoelectric conversion elements corresponding to one microlense;
a read-out unit configured to read out a first signal through addition from the plurality of photoelectric conversion elements corresponding to the one microlense, and to read out a second signal from one of the plurality of photoelectric conversion elements corresponding to the one microlense; and
a setting unit configured to set a read-out mode of the read-out unit to read signal from the image pickup unit in accordance with a defocus amount, into first and second read out modes, (1) such that (A) a thinning-out rate or an addition rate of the second signal in an area from which the second signal is read out according to the first read out mode is different from (B) a thinning-out rate or an addition rate of the second signal in the area from which the second signal is read out according to the second read out mode, and (2) such that a number of plurality of image pick up elements from which the second signal is read out in whole of the image pickup unit according to the first read out mode is maintained as being equal to a number of plurality of image pick up elements from which the second signal is read out in whole of the image pickup unit according to the second read out mode.

34. The image pickup apparatus according to claim 33, wherein the first read-out mode and the second read-out mode differ from each other in the thinning-out rate of columns from which the second signal is read out.

35. The image pickup apparatus according to claim 33, wherein the first read-out mode and the second read-out mode differ from each other in the addition rate of columns from which the second signal is read out.

36. The image pickup apparatus according to claim 33, further comprising a signal processing unit configured to generate a third signal corresponding to the second signal using the first signal and the second signal from the image pickup unit.

37. The image pickup apparatus according to claim 36, wherein the signal processing unit calculates a defocus amount from the second signal and the third signal.

38. The image pickup apparatus according to claim 33, wherein an exit pupil of a photographing lens is divided by the microlen and the plurality of photoelectric conversion elements corresponding to the microlen.

39. The image pickup apparatus according to claim 33, wherein the setting unit sets the read-out mode according to a defocus amount.

40. The image pickup apparatus according to claim 33, wherein the setting unit sets the read-out mode according to an aperture value.

41. The image pickup apparatus according to claim 33, wherein the first read-out mode and the second read-out mode differ from each other in a range and the thinning-out rate of both a pixel from which a pixel signal of predetermined photoelectric conversion element is read out and a pixel from which the first signal is read out.

42. The image pickup apparatus according to claim 40, wherein when the aperture value is a second value smaller than a first value, the setting unit expands a selection range of the pixel from which the pixel signal of predetermined photoelectric conversion element is read out.

\* \* \* \* \*